United States Patent
Lin et al.

(10) Patent No.: US 9,768,303 B2
(45) Date of Patent: Sep. 19, 2017

(54) METHOD AND STRUCTURE FOR FINFET DEVICE

(71) Applicant: Taiwan Semiconductor Manufacturing Co., Ltd., Hsin-Chu (TW)

(72) Inventors: Kuo-Yin Lin, Hsinchu County (TW); Teng-Chun Tsai, Hsinchu (TW); Po-Yu Lin, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/226,746

(22) Filed: Aug. 2, 2016

(65) Prior Publication Data

US 2017/0213912 A1   Jul. 27, 2017

Related U.S. Application Data

(60) Provisional application No. 62/287,537, filed on Jan. 27, 2016.

(51) Int. Cl.
*H01L 21/311* (2006.01)
*H01L 29/66* (2006.01)
(Continued)

(52) U.S. Cl.
CPC .... *H01L 29/7849* (2013.01); *H01L 21/02631* (2013.01); *H01L 21/30625* (2013.01);
(Continued)

(58) Field of Classification Search
CPC ........................ H01L 21/845; H01K 29/7849
(Continued)

(56) References Cited

U.S. PATENT DOCUMENTS 8,361,842 B2   1/2013   Yu et al.
8,680,647 B2   3/2014   Yu et al.
(Continued)

OTHER PUBLICATIONS

Patrick Ong, Lieve Teugels, Sheik Ansar, Martine Delande, Rithu Bhonsle, Max Siebert, Leonardus Leunissen, "Updates on Ge and SiGe CMP Processes for Integration as High Mobility Channel Materials," IMEC, BASF and Clarkson University, International Conference on Planzrization/CMP Technology (ICPT), 2015, p. 4.

*Primary Examiner* — David Vu
*Assistant Examiner* — Brandon Fox
(74) *Attorney, Agent, or Firm* — Haynes and Boone, LLP

(57) ABSTRACT

A method includes providing a semiconductor substrate having first and second regions that are doped with first and second dopants respectively. The first and second dopants are of opposite types. The method further includes epitaxially growing a first semiconductor layer that is doped with a third dopant. The first and third dopants are of opposite types. The method further includes depositing a dielectric hard mask (HM) layer over the first semiconductor layer; patterning the dielectric HM layer to have an opening over the first region; extending the opening towards the semiconductor substrate; and epitaxially growing a second semiconductor layer in the opening. The second semiconductor layer is doped with a fourth dopant. The first and fourth dopants are of a same type. The method further includes removing the dielectric HM layer; and performing a first CMP process to planarize both the first and second semiconductor layers.

20 Claims, 18 Drawing Sheets

(51) Int. Cl.
  *H01L 29/78*   (2006.01)
  *H01L 21/02*   (2006.01)
  *H01L 29/06*   (2006.01)
  *H01L 21/306*  (2006.01)
  *H01L 21/84*   (2006.01)

(52) U.S. Cl.
  CPC ........ *H01L 21/845* (2013.01); *H01L 29/0649* (2013.01); *H01L 29/66795* (2013.01); *H01L 29/7851* (2013.01)

(58) Field of Classification Search
  USPC .................................. 438/703; 257/347, 401
  See application file for complete search history.

(56) References Cited

U.S. PATENT DOCUMENTS

| | | | |
|---|---|---|---|
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 9,583,492 | B2 * | 2/2017 | Cheng ............... H01L 21/82382 |
| 2011/0291288 | A1 | 12/2011 | Wu et al. |
| 2013/0026468 | A1 | 1/2013 | Yoshimuta et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0307140 | A1 | 11/2013 | Huang et al. |
| 2014/0203429 | A1 | 7/2014 | Yu et al. |
| 2014/0225222 | A1 | 8/2014 | Yu et al. |
| 2014/0252646 | A1 | 9/2014 | Hung et al. |
| 2014/0264930 | A1 | 9/2014 | Yu et al. |
| 2015/0340381 | A1 * | 11/2015 | Ramachandran ... H01L 27/1211 257/351 |
| 2017/0005113 | A1 * | 1/2017 | Cheng ................ H01L 27/1211 |

* cited by examiner

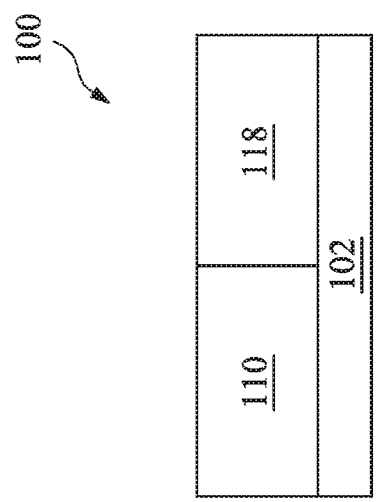
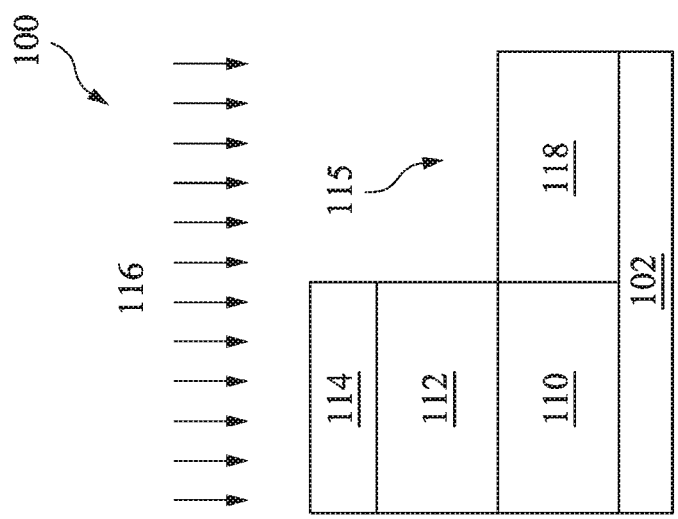
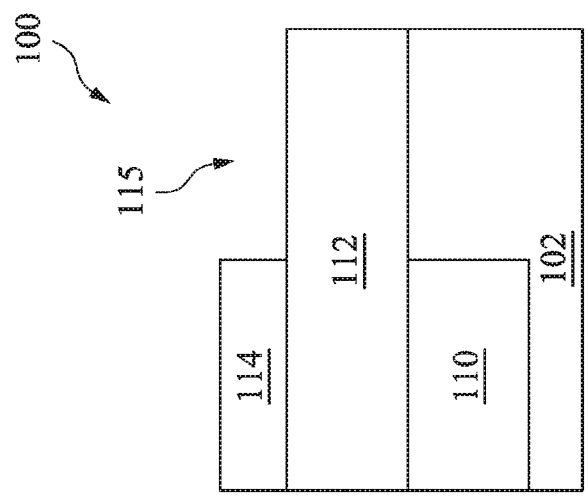
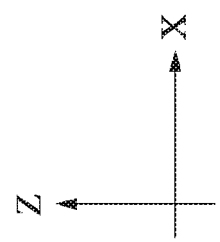
FIG. 2D   FIG. 2E   FIG. 2F

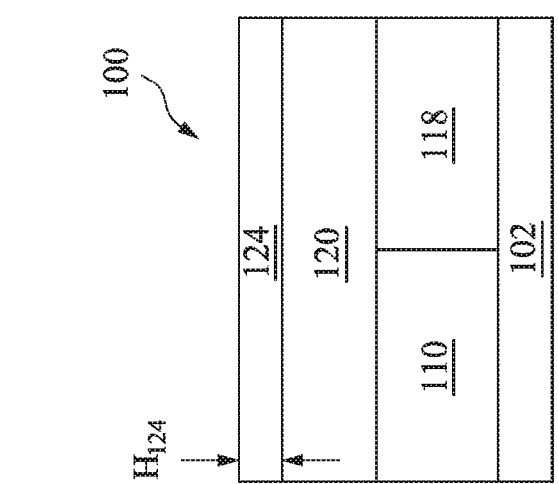
FIG. 2I
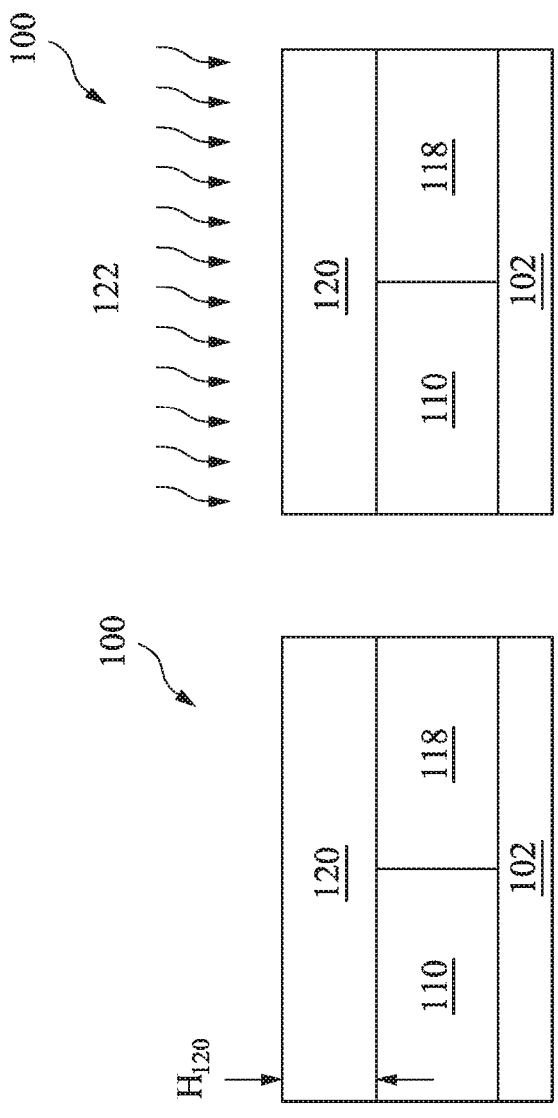
FIG. 2H
FIG. 2G
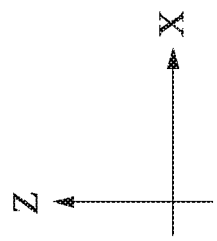

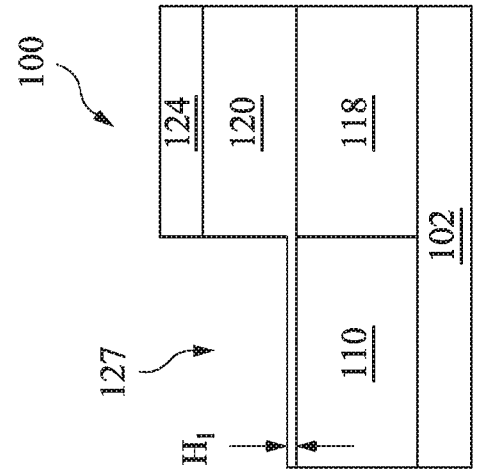
FIG. 2L
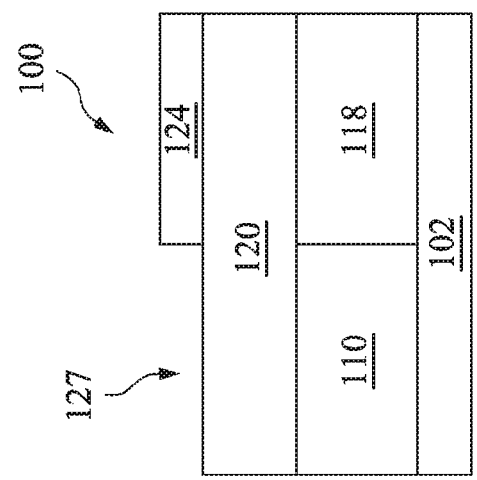
FIG. 2K
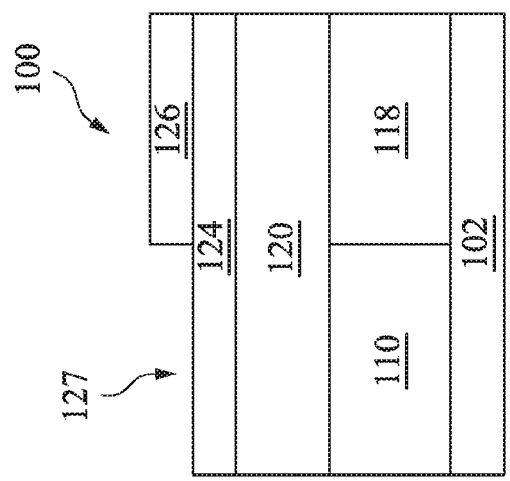
FIG. 2J
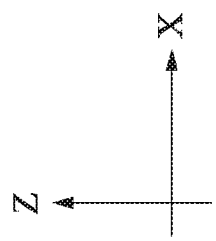

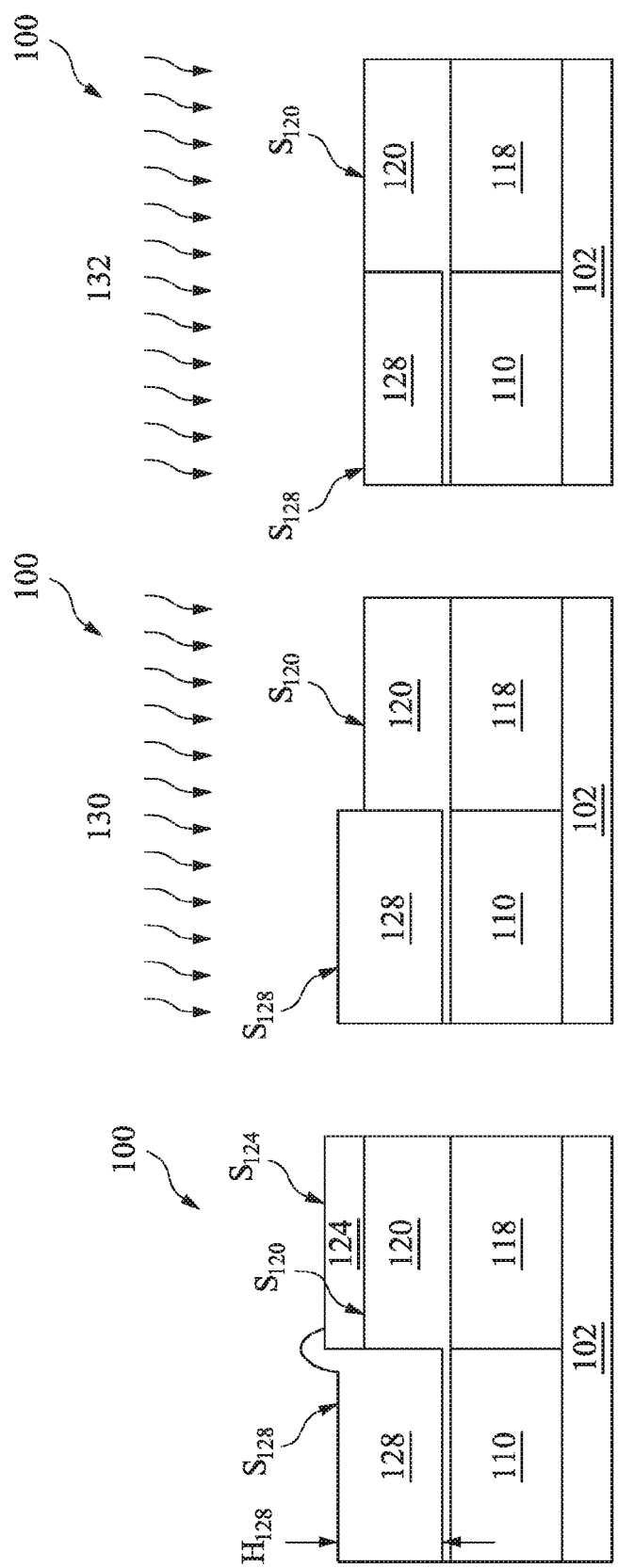

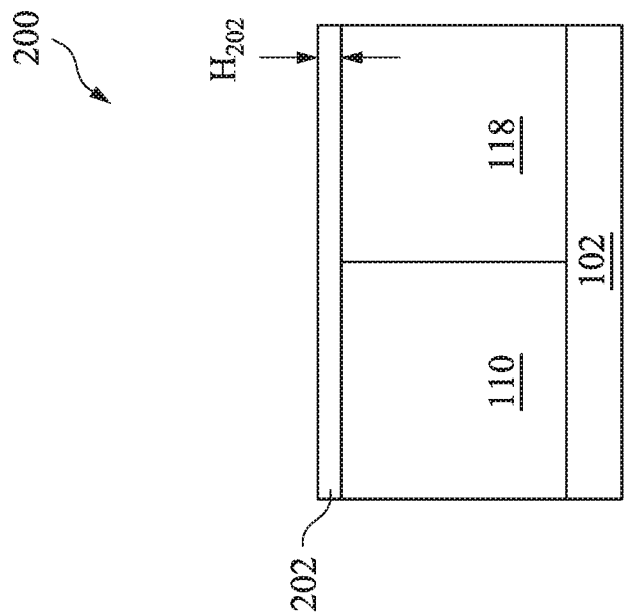
FIG. 4B
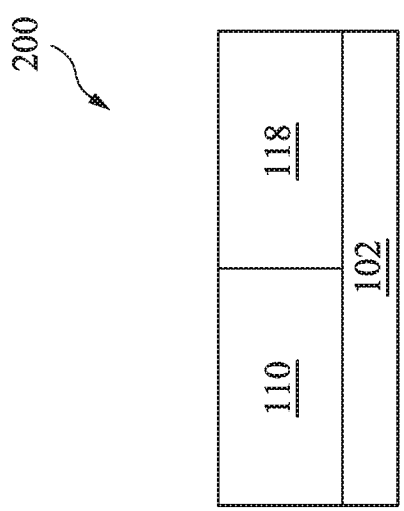
FIG. 4A
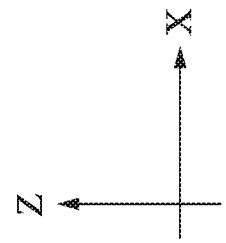

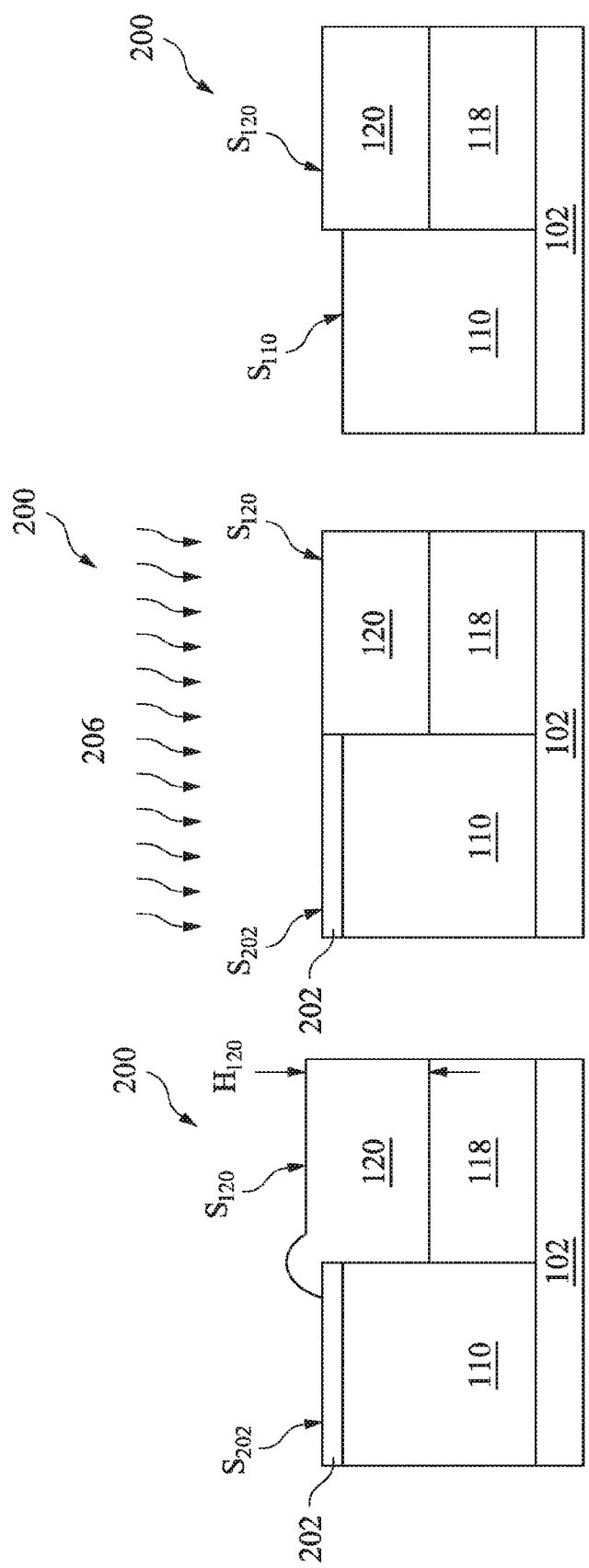

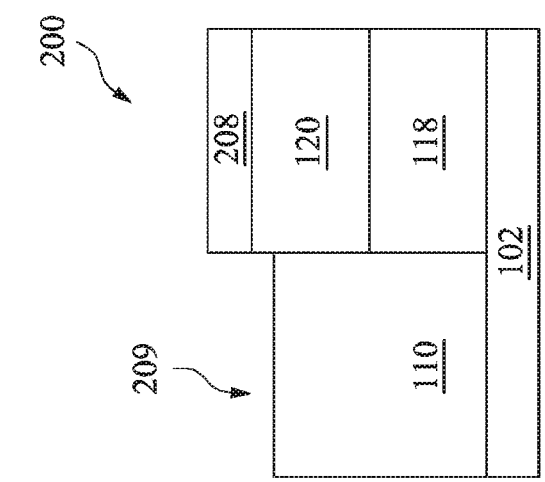
FIG. 4K
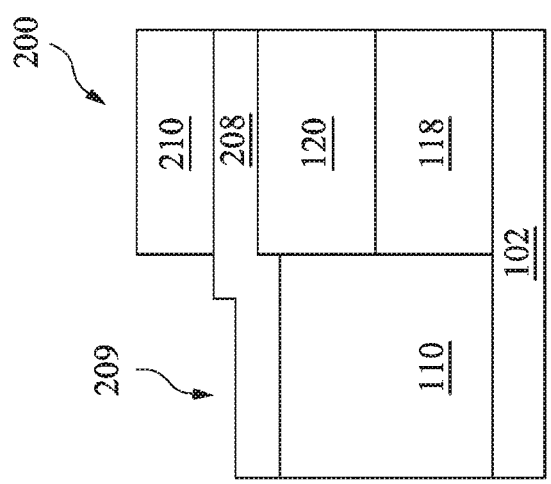
FIG. 4J
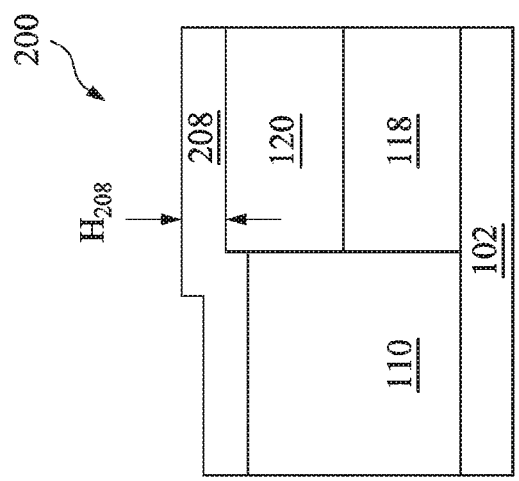
FIG. 4I
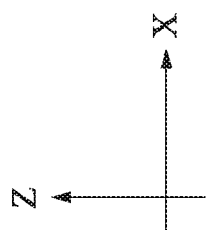

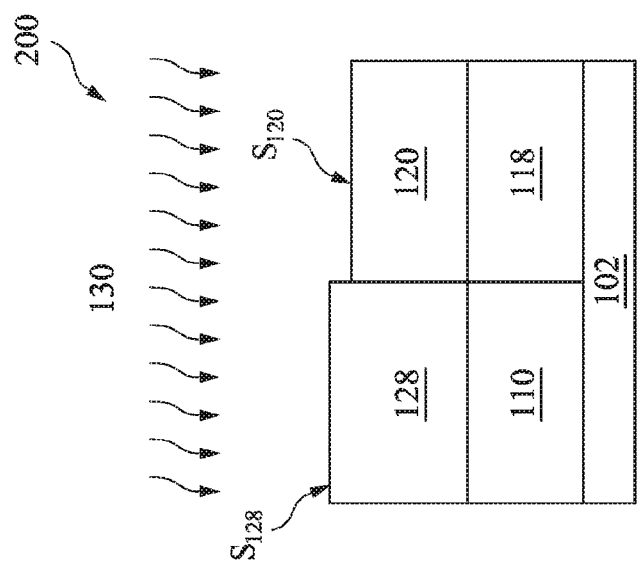
FIG. 4N
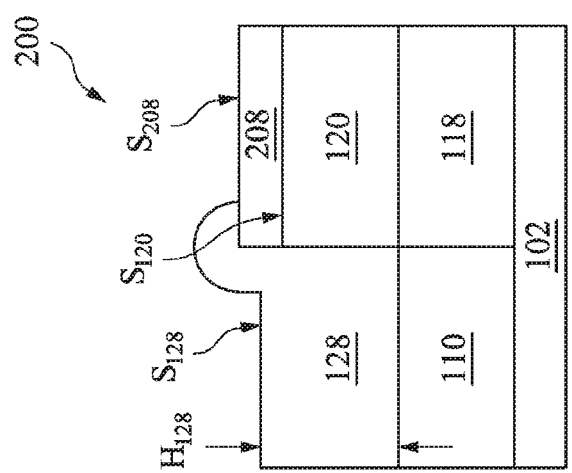
FIG. 4M
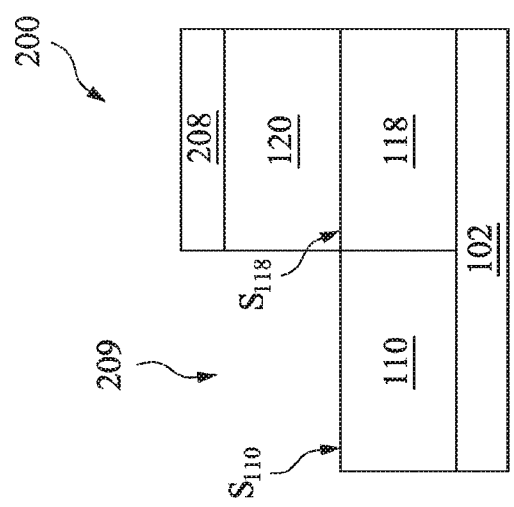
FIG. 4L
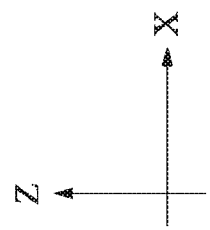

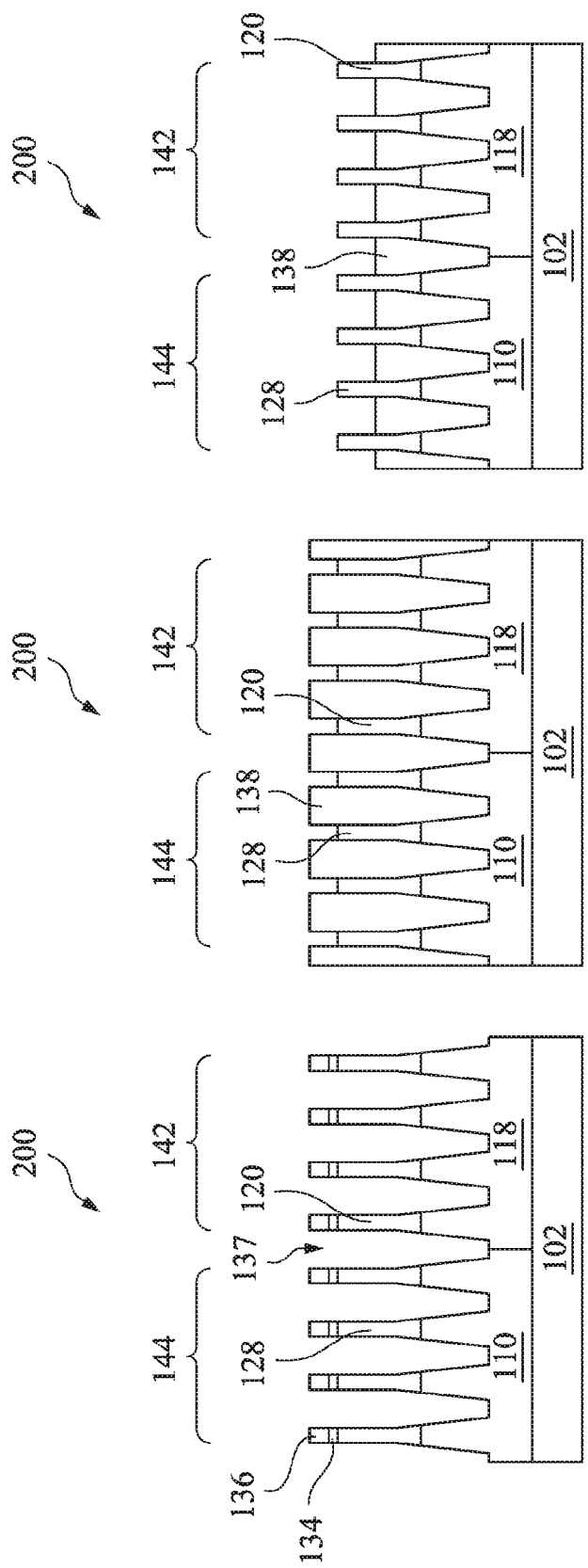

METHOD AND STRUCTURE FOR FINFET DEVICE

PRIORITY DATA

This application claims the benefit of U.S. Prov. App. No. 62/287,537 entitled "Method and Structure for FinFET Devices," filed Jan. 27, 2016, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, multi-gate devices have been introduced in an effort to improve gate control by increasing gate-channel coupling, reduce OFF-state current, and reduce short-channel effects (SCEs). One type of the multi-gate devices is FinFETs—transistors with a fin-like semiconductor channel ("fin") and a gate electrode engaging the fin on two or three sides thereof.

Typical methods of forming fins include a replacement fin approach and a strain relaxed buffer (SRB) approach. Both approaches have their drawbacks. A typical replacement fin approach forms dielectric trenches over a substrate and epitaxially grows semiconductor fins over the substrate and in the dielectric trenches. Defects typically exist on the interface between the semiconductor fins and the surrounding dielectric material. A typical SRB approach forms thick epitaxial films (e.g., over 1 micron ($\mu$m)) over an entire wafer, and etches the epitaxial films to form semiconductor fins. Lattice mismatch between the upper epitaxial films and the substrate are gradually decreased to provide quality epitaxial layers. However, thick epitaxial films over an entire wafer could result in severe crosshatch pattern defect, in addition to increased material costs.

Accordingly, new and improved methods for forming fins are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A, 2B, 2C, 2D, 2E, 2F, 2G, 2H, 2I, 2J, 2K, 2L, 2M, 2N, 2O, 2P, 2Q, and 2R are cross-sectional views of a portion of a semiconductor device in various fabrication stages according to the method in FIGS. 1A-1B, in accordance to an embodiment.

FIGS. 4A, 4B, 4C, 4D, 4E, 4F, 4G, 4H, 4I, 4J, 4K, 4L, 4M, 4N, 4O, 4P, 4Q, and 4R are cross-sectional views of a portion of a semiconductor device in various fabrication stages according to the method in FIGS. 3A-3C, in accordance to an embodiment.

DETAILED DESCRIPTION

Figure 1A:
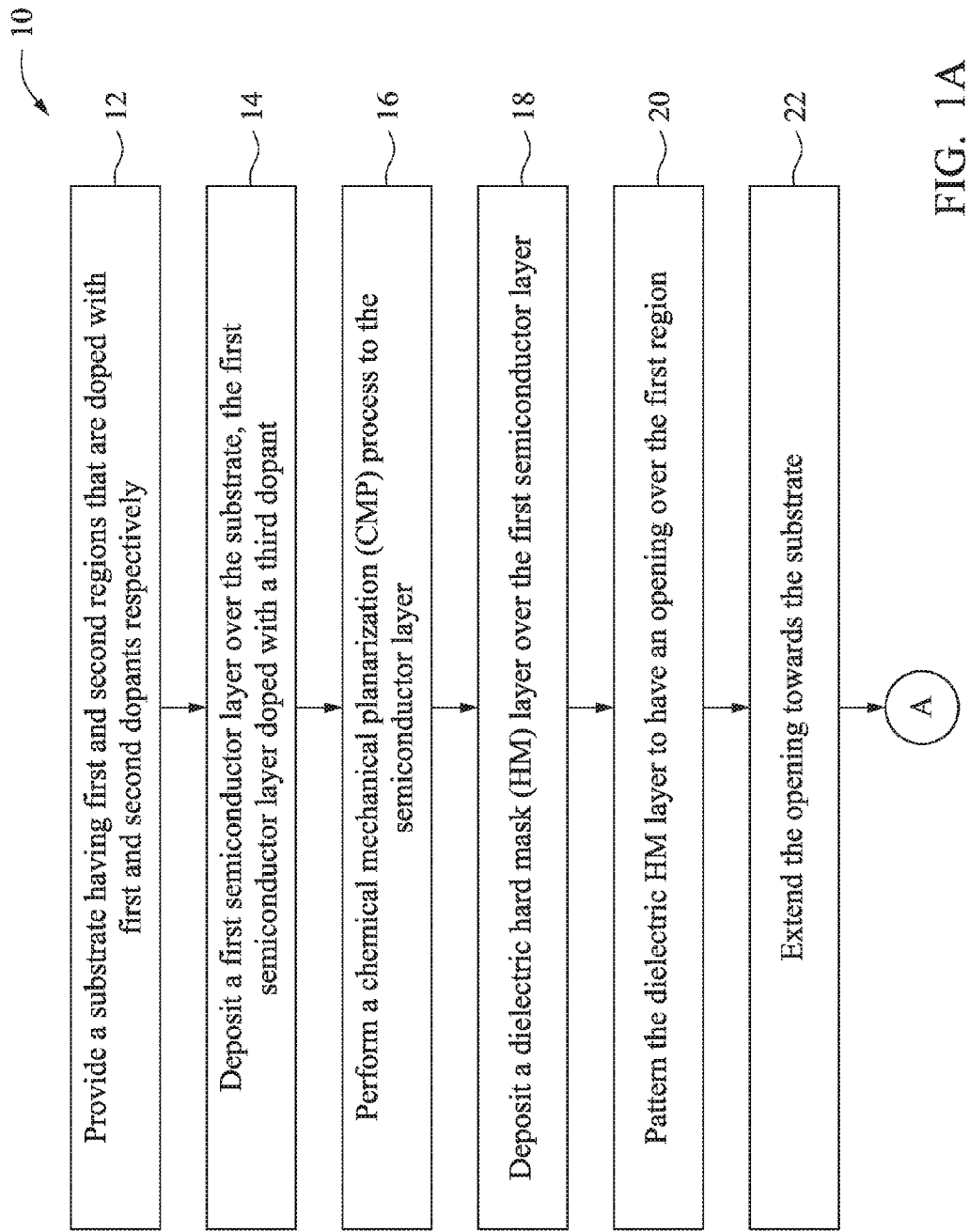
FIGS. 1A and 1B are a flow chart of a method of forming a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for semiconductor device fabrication, and more particularly to methods of forming semiconductor fins for FinFETs. According to embodiments of the present disclosure, the semiconductor fins comprise one or more semiconductor layers. The one or more semiconductor layers are epitaxially grown as thin layers, thereby reducing material costs compared with the SRB approach. Some of the semiconductor layers are grown locally rather than on the entire wafer, preventing crosshatch pattern defects. Furthermore, the one or more semiconductor layers do not have sidewall interfaces with a dielectric layer, reducing interface defects and improving epitaxial film quality. Embodiments of the present disclosure can be easily integrated into existing manufacturing flows, particularly, for complementary metal oxide semiconductor (CMOS) device fabrication. One of ordinary skill may recognize other examples of semiconductor manufacturing flows and devices that may benefit from aspects of the present disclosure.

Figure 1B:
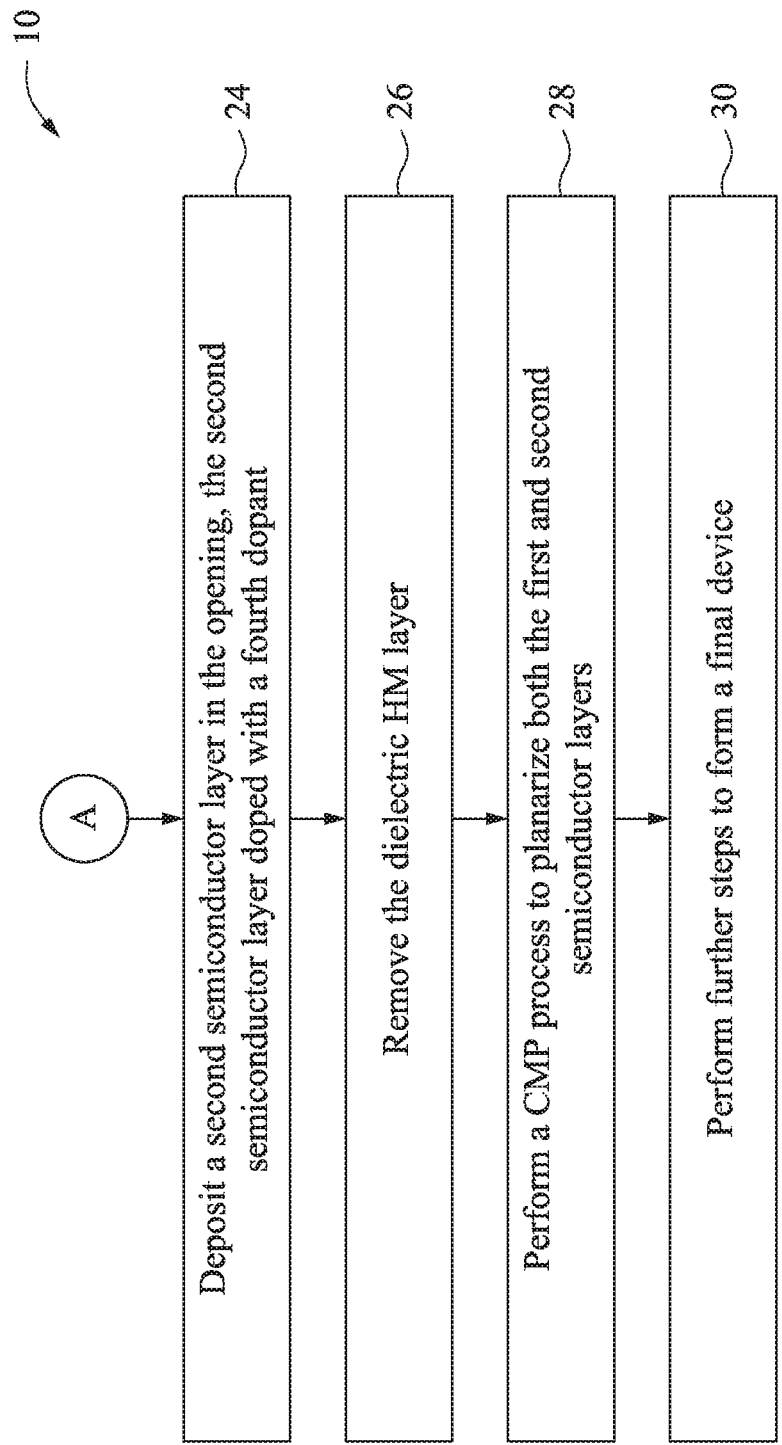

FIGS. 1A and 1B show a flow chart of a method 10 of forming a semiconductor device 100, according to various aspects of the present disclosure. FIGS. 3A, 3B, and 3C show a flow chart of a method 50 of forming a semiconductor device 200, according to various aspects of the present disclosure. The method 50 may be considered an embodiment of the method 10, as will be discussed later. The methods 10 and 50 are merely examples, and are not intended to limit the present disclosure beyond what is explicitly recited in the claims. Additional operations can be provided before, during, and after the methods 10 and 50, and some operations described can be replaced, eliminated, or relocated for additional embodiments of the methods. The method 10 is described below in conjunction with FIGS. 2A-2R, which show cross-sectional views of a portion of the semiconductor device 100 in intermediate stages of fabrication. The method 50 is described below in conjunction with FIGS. 4A-4R, which show cross-sectional views of a portion of the semiconductor device 200 in intermediate stages of fabrication.

As will be shown, the semiconductor devices 100 and 200 are similar in many respects. Each of the semiconductor devices 100 and 200 may be included in an IC such as a microprocessor, memory device, and/or other IC which may comprise passive components such as resistors, capacitors, and inductors, and active components such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, high frequency transistors, multi-gate FETs including FinFETs, and combinations thereof.

Referring to FIG. 1A, at operation 12, the method 10 provides (or is provided with) a precursor of the device 100 that comprises a substrate 102 having a first region 110 and a second region 118 (FIG. 2F). The first region 110 and second region 118 are doped with opposite types of dopants. In embodiments, the substrate 102 may be a semiconductor substrate such as a silicon wafer. The substrate 102 may also comprise other semiconductors such as germanium; a compound semiconductor such as silicon carbide, gallium arsenide, gallium phosphide, indium phosphide, indium arsenide, and/or indium antimonide; an alloy semiconductor such as GaAsP, AlInAs, AlGaAs, InGaAs, GaInP, and/or GaInAsP, or combinations thereof. Further, the substrate 102 may optionally include epitaxial layers, be strained for performance enhancement, include a silicon-on-insulator structure, and/or have other suitable enhancement features.

In an embodiment, the first and second regions, 110 and 118, are adjacent and may overlap each other. For example, the first and second regions 110 and 118 may establish a p-n junction in the substrate 102. In another embodiment, the first and second regions 110 and 118 are not adjacent. The first region 110 is doped with a first dopant, and the second region 118 is doped with a second dopant. In an embodiment, the first dopant is a p-type dopant such as boron, indium, another suitable p-type dopant, or a combination thereof; and the second dopant is an n-type dopant such as phosphorus, arsenic, another suitable n-type dopant, or a combination thereof. In another embodiment, the first dopant is an n-type dopant and the second dopant is a p-type dopant.

Figure 2A:
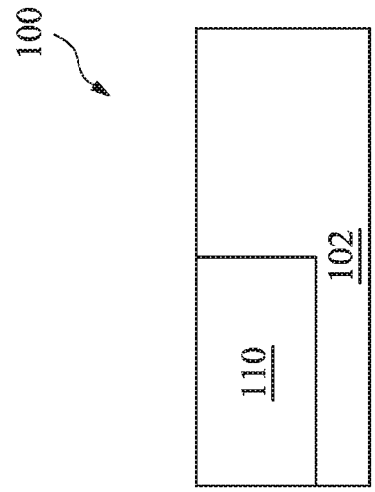

The device 100 as shown in FIG. 2F may be formed by a variety of processes. One exemplary process is illustrated in FIGS. 2A-2E. Referring to FIG. 2A, a dielectric layer 104 is deposited over the substrate 102 that has not been doped with the first and second dopants. A resist (or photoresist) pattern 106 is formed over the dielectric layer 104 through a photolithography process. In an embodiment, the dielectric layer 104 is a bottom anti-reflective coating (BARC) layer and may be deposited using chemical vapor deposition (CVD), plasma enhanced CVD (PECVD), physical vapor deposition (PVD), or other suitable techniques. In an example, the photolithography process may include spin-coating a resist layer over the dielectric layer 104, exposing the resist layer to a pattern, performing post-exposure bake processes, and developing the resist layer to form the resist pattern 106. The resist pattern 106 provides one or more openings 107 that expose the dielectric layer 104.

Figure 2B:
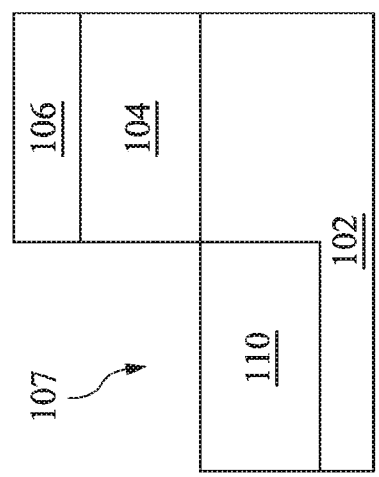
Figure 3A:
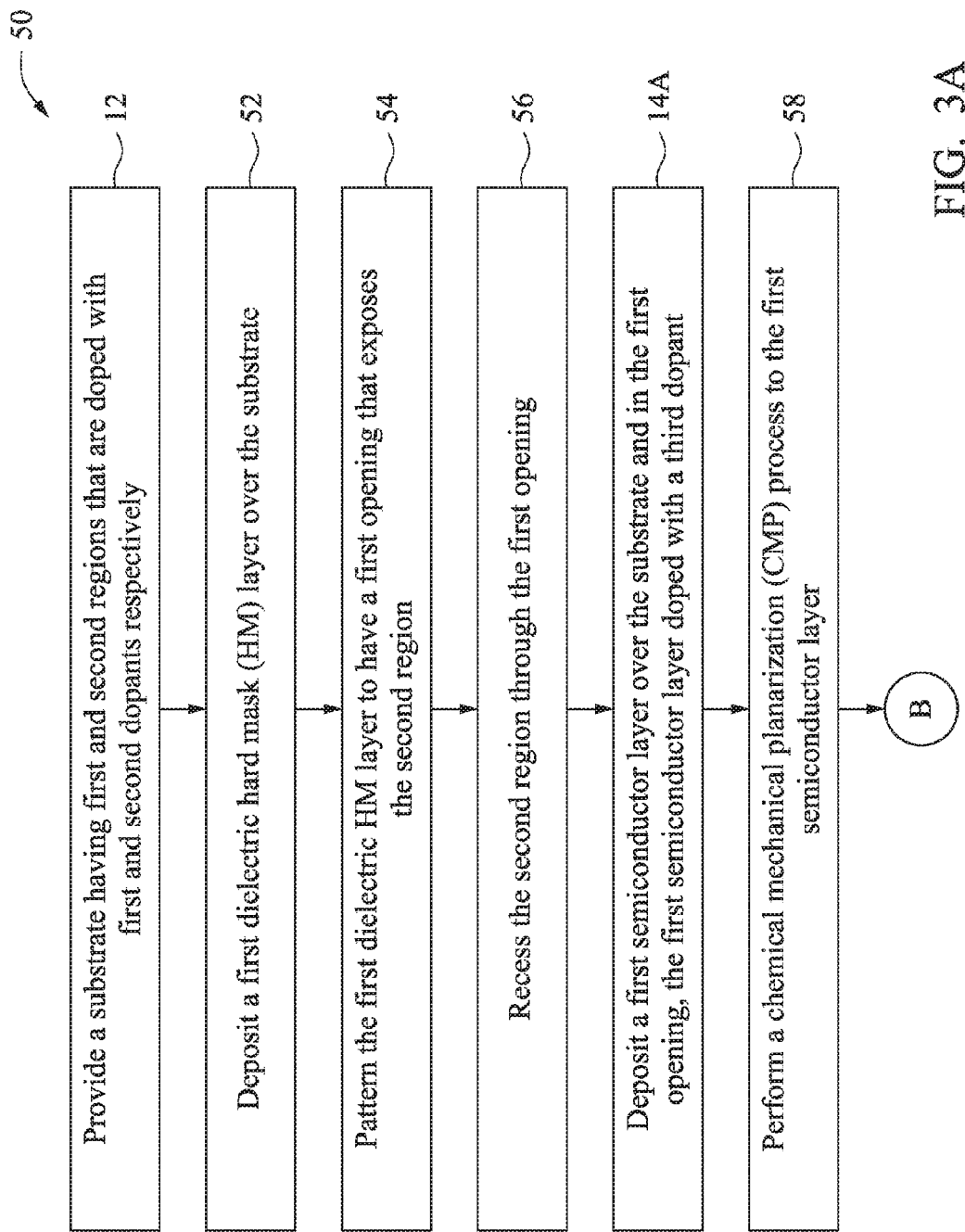
FIGS. 3A, 3B, and 3C are a flow chart of another method of forming a semiconductor device according to various aspects of the present disclosure.
Figure 3B:
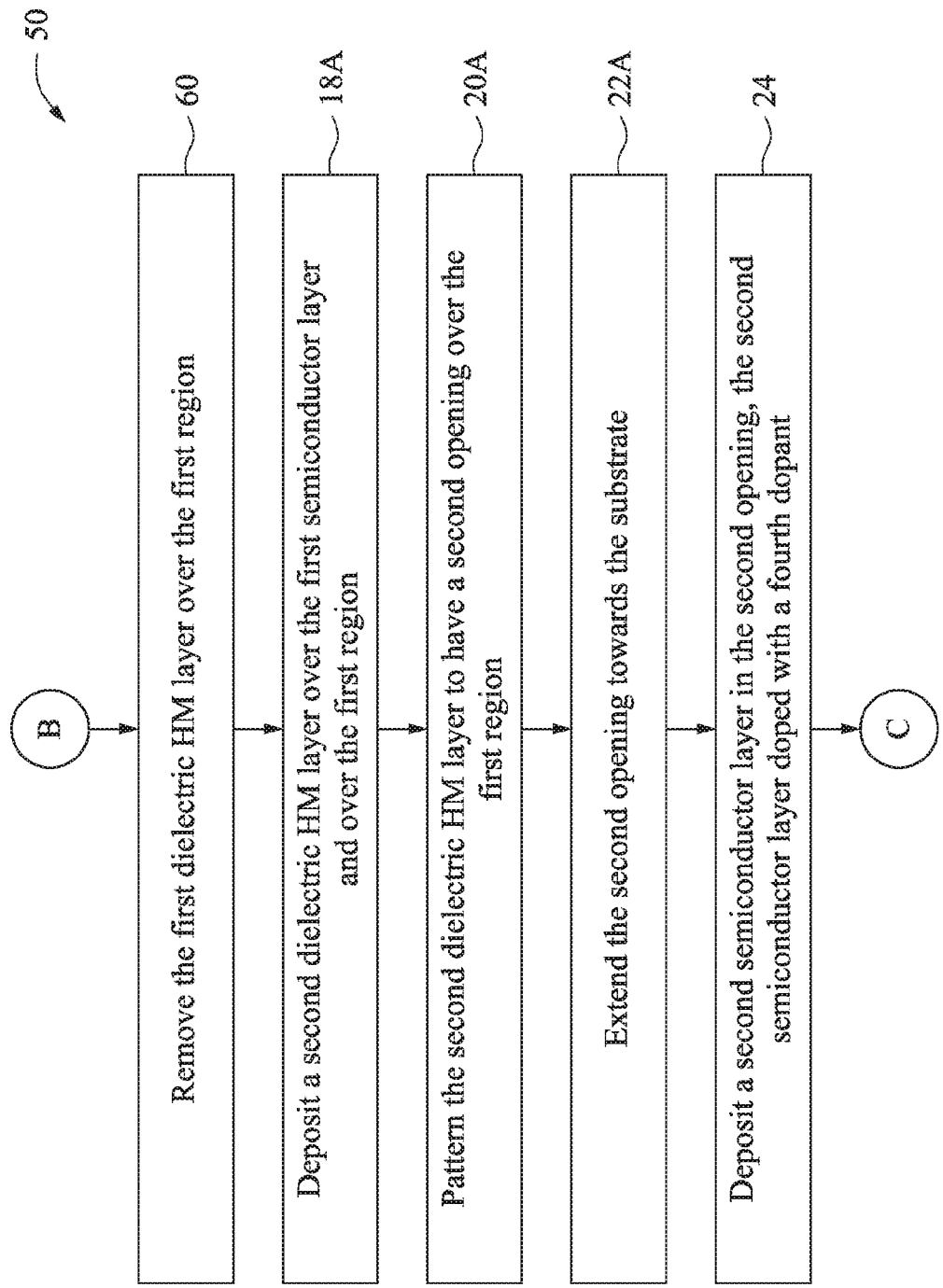
Figure 3C:
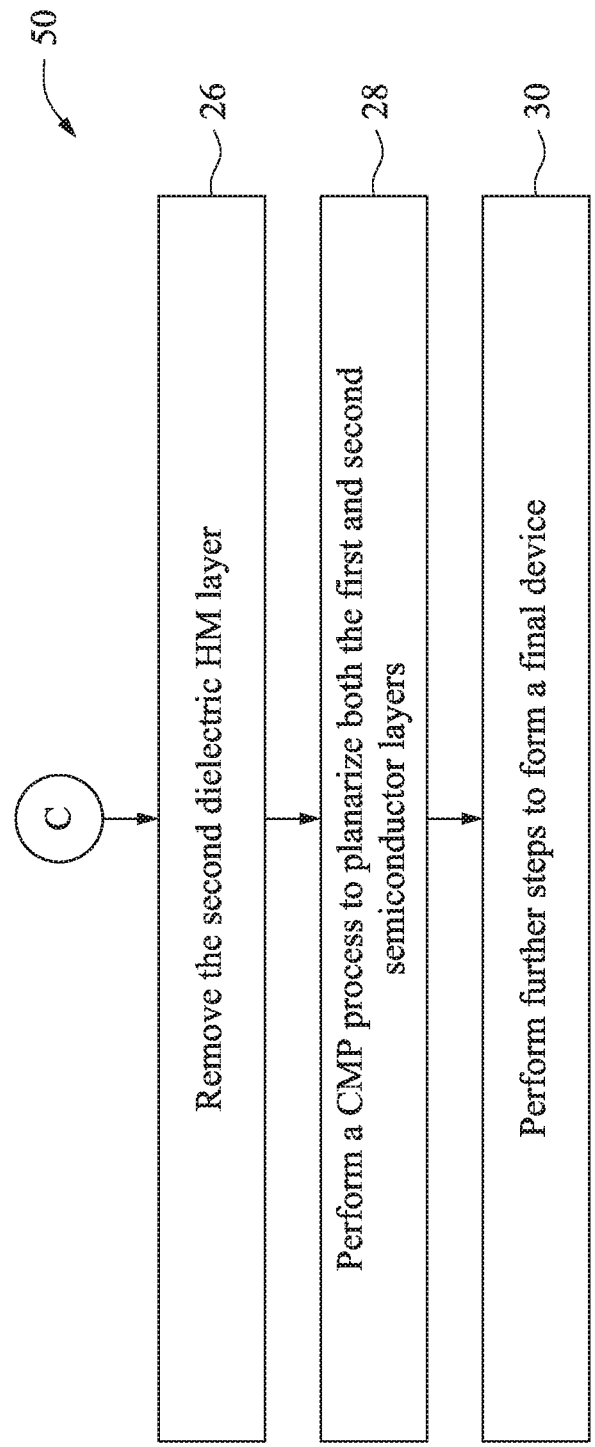

Referring to FIG. 2B, the dielectric layer 104 is etched through the opening(s) 107 to expose the first region 110 in the substrate. The dielectric layer 104 may be etched using a dry etching process, a wet etching process, or other suitable etching techniques. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant.

Still referring to FIG. 2B, after the first region 110 is exposed in the opening(s) 107, the method 10 performs an ion implantation process 108 that dopes the first region 110 with the first dopant.

Figure 2C:
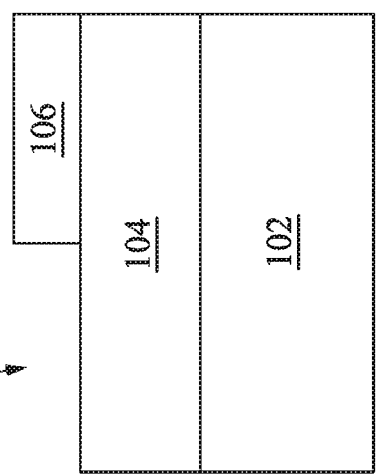

Referring to FIG. 2C, the resist pattern 106 and the dielectric layer 104 are removed, for example, by a stripping process and an etching process respectively. The method 10 may optionally perform an annealing process to activate the first dopant in the first region 110.

Referring to FIG. 2D, another dielectric layer 112 is deposited over the substrate 102 and another resist pattern 114 is formed over the dielectric layer 112. The material and formation of the dielectric layer 112 and the resist pattern 114 may be similar to those of the dielectric layer 104 and the resist pattern 106, respectively. The resist pattern 114 provides one or more openings 115 that expose the dielectric layer 112.

Referring to FIG. 2E, the dielectric layer 112 is etched through the opening(s) 115 to expose the second region 118 in the substrate 102. Subsequently, the method 10 performs another ion implantation process 116 that dopes the second region 118 with the second dopant. Referring to FIG. 2F, the resist pattern 114 and the dielectric layer 112 are removed. In an embodiment, the method 10 performs an annealing process to activate the dopants in the first and second regions, 110 and 118.

At operation 14, the method 10 (FIG. 1A) deposits a semiconductor layer 120 (FIG. 2G) over the substrate 102. Referring to FIG. 2G, in the present embodiment, the semiconductor layer 120 is deposited over an entire surface of the substrate 102 (e.g., an entire wafer) using an epitaxial growth process. The epitaxial growth process may be a molecular beam epitaxy (MBE) process, a chemical vapor deposition (CVD) process such as a metal organic CVD (MOCVD) process or a low pressure CVD (LPCVD) process, and/or other suitable epitaxial growth processes. Further, the semiconductor layer 120 is grown to a thickness $H_{120}$ ranging from 50 nanometers (nm) to 200 nm, which is substantially thinner than epitaxial layers in typical SRB approaches which are usually more than 1 μm thick. The thin semiconductor layer 120 does not suffer from crosshatch pattern defects that are generally seen with the thick epitaxial layers in the SRB approach.

Further, the semiconductor layer 120 is in-situ or ex-situ (with respect to the epitaxial growth process) doped with a third dopant, wherein the first and third dopants are of opposite types (i.e., the second and third dopants are of the same type). In an embodiment, the third dopant is an n-type dopant such as phosphorus, arsenic, another suitable n-type dopant, or a combination thereof; and the semiconductor layer 120 comprises silicon, silicon phosphide, silicon carbide phosphide, germanium, or a III-V semiconductor such as indium phosphide, gallium arsenide, aluminum arsenide, indium arsenide, indium aluminum arsenide, and indium gallium arsenide. In another embodiment, the third dopant is a p-type dopant such as boron, indium, another suitable p-type dopant, or a combination thereof; and the semiconductor layer 120 comprises silicon, silicon germanium, germanium, or a III-V semiconductor such as indium antimonide, gallium antimonide, and indium gallium antimonide.

At operation 16, the method 10 (FIG. 1A) performs a chemical mechanical planarization (CMP) process 122 to the semiconductor layer 120 to planarize the top surface of the semiconductor layer 120 (FIG. 2H). In an embodiment, the operation 16 is optional and is performed only when the root square mean of surface roughness, Rq, of the semiconductor 120 is greater than a threshold, such as 0.5 nm. In alternative embodiments, different thresholds or different measures of the threshold may be used for the operation 16. In an embodiment, the CMP process 122 uses a soft polishing pad and a slurry suitable for polishing the semiconductor layer 120. In a further embodiment, the CMP process 122 is performed by a CMP tool integrated with an optical metrology tool for closed loop control such that the CMP process 122 is stopped in a timely manner once the desired surface roughness of the semiconductor layer 120 is achieved. In an alternative embodiment, the CMP process 122 is controlled using a timer mode to achieve the desired surface roughness of the semiconductor layer 120.

At operation 18, the method 10 (FIG. 1A) deposits a dielectric hard mask (HM) layer 124 over the first semiconductor layer 120 (FIG. 2I). In the present embodiment, the dielectric HM layer 124 is deposited as a thin HM layer with a thickness $H_{124}$ ranging from 5 nm to 50 nm. In embodiments, the dielectric HM layer 124 may comprise silicon oxide, silicon nitride, silicon oxynitride, silicon carbide, silicon carbide nitride, silicon carbide oxynitride, or another suitable dielectric material. The dielectric HM layer 124 may be formed using thermal oxidation, CVD, PECVD, PVD, atomic layer deposition (ALD), or other suitable techniques. In the present embodiment, the dielectric HM layer 124 is deposited over the entire surface of the first semiconductor layer 120.

At operation 20, the method 10 (FIG. 1A) patterns the dielectric HM layer 124 to form an opening 127 over the first region 110 (FIGS. 2J and 2K). Referring to FIG. 2J, a resist pattern 126 is formed over the dielectric HM layer 124 and provides the opening 127. The patterning process of the resist pattern 126 is similar to that of the resist pattern 106 (FIG. 2A). Referring to FIG. 2K, the dielectric HM layer 124 is etched through the opening 127 to expose the semiconductor layer 120. The resist pattern 126 is subsequently removed, for example, by a stripping process. The dielectric HM layer 124 may be etched using a dry etching process, a wet etching process, an atomic layer etching process, or another suitable technique.

At operation 22, the method 10 (FIG. 1A) extends the opening 127 towards the substrate 102. Referring to FIG. 2L, the opening 127 is extended by etching the material layers underneath, including the semiconductor layer 120 and the first region 110. In an embodiment, the semiconductor layer 120 is partially etched through the opening 127. The remaining portion of the semiconductor 120 over the first region 110 may be used for fine-tuning device performance, such as reducing device leakage and balancing circuit characteristics between n-type and p-type MOS devices. In another embodiment, the portion of the semiconductor layer 120 over the first region 110 is completely removed through the opening 127. In yet another embodiment, not only is the portion of the semiconductor layer 120 over the first region 110 completely removed, but also is the first region 110 partially removed through the opening 127. In embodiments, the remaining portion of the semiconductor layer 120 directly over the first region 110 has a thickness $H_1$ ranging from 0 nm to about 50 nm. In an embodiment, the semiconductor layer 120, and optionally the first region 110, is etched using a dry etching process. The etching is controlled using a timer mode to achieve a desired thickness of $H_1$ or a desired thickness of the first region 110 if $H_1$ is 0 nm. The dielectric HM layer 124 protects the semiconductor layer 120 over the second region 118 during the etching process. In the present disclosure, the opening 127 is also called a semiconductor trench 127 because it is surrounded by semiconductor material at its bottom and sidewalls (a top portion of the opening 127 is adjacent to the dielectric HM layer 124, but this portion is insignificant as will be discussed later).

At operation 24, the method 10 (FIG. 1B) deposits a second semiconductor layer 128 in the opening 127 (FIG. 2M), which interfaces with either the semiconductor layer 120 or the first region 110 (see the discussion of the operation 22 above). Referring to FIG. 2M, a surface $S_{128}$ of the semiconductor layer 128 is higher than a top surface $S_{120}$ of the semiconductor layer 120 directly over the second region 118 and is lower than a top surface $S_{124}$ of the dielectric HM layer 124 directly over the second region 118. Further, a small portion of the semiconductor layer 128 may be deposited over the dielectric HM layer 124.

The semiconductor layer 128 is doped with a fourth dopant, wherein the first and fourth dopants are of the same type (i.e., both are n-type dopants or both are p-type dopants). In an embodiment, the semiconductor layer 128 is deposited using an epitaxial growth process which may be an MBE process, an MOCVD process, an LPCVD process, or another suitable epitaxial growth process. The semiconductor layer 128 is doped with the fourth dopant in-situ or ex-situ. Further, the semiconductor layer 128 is deposited to a thickness $H_{128}$ ranging from 30 nm to 150 nm. Notably, the semiconductor layer 128 interfaces directly with semiconductor materials (the semiconductor layer 120 and optionally the first region 110). Therefore, interface defects of the semiconductor layer 128 are reduced compared to epitaxial layers grown by typical replacement fin approaches. As will be shown later, the small interface between the semiconductor layer 128 and the dielectric HM layer 124 will be removed in a subsequent CMP process.

In an embodiment, the fourth dopant is an n-type dopant such as phosphorus, arsenic, another suitable n-type dopant, or a combination thereof; and the semiconductor layer 128 comprises silicon, silicon phosphide, silicon carbide phosphide, germanium, or a III-V semiconductor such as indium phosphide, gallium arsenide, aluminum arsenide, indium arsenide, indium aluminum arsenide, and indium gallium arsenide. In another embodiment, the fourth dopant is a p-type dopant such as boron, indium, another suitable p-type dopant, or a combination thereof; and the semiconductor layer 128 comprises silicon, silicon germanium, germanium, or a III-V semiconductor such as indium antimonide, gallium antimonide, and indium gallium antimonide.

At operation 26, the method 10 (FIG. 1B) removes the dielectric HM layer 124. In an embodiment, the operation 26 performs a CMP process 130 to remove the dielectric HM layer 124, wherein the CMP process 130 stops on the semiconductor layers 120 and 128 (FIG. 2N). In the present embodiment, the CMP process 130 is tuned to remove the dielectric HM layer 124 faster than to remove the semiconductor layers 120 and 128, i.e., the removal rate of the dielectric HM layer 124 is higher than the removal rates of the semiconductor layers 120 and 128. For example, the CMP process 130 is tuned to remove the dielectric HM layer 124 at least ten times faster than to remove the semiconductor layers 120 and 128. The removal rates for the semiconductor layers 120 and 128 are about the same. This is to ensure that the second semiconductor layer 128 does not suffer from much film loss when the dielectric HM layer 124 is removed, although it may incur some film loss.

In embodiments, the above CMP removal rate selectivity may be tuned by choosing appropriate CMP consumables such as CMP polishing pad, CMP slurry, and CMP conditioner. For example, the structure of the CMP polishing pad (e.g., pores and/or grooves) and its material property (e.g., hardness) may be selected based on the materials to be removed. For example, typical CMP slurry consists of abrasives, pH adjustors, and one or more additives such as oxidizing agents, complexing agents, corrosion inhibitors, and dispersion agents. The various components of the CMP slurry may be tuned based on the materials to be removed. In the present embodiment, the CMP process 130 uses a hard CMP polishing pad and a CMP slurry that are selective to the material of the dielectric HM layer 124. In a further embodiment, the CMP process 130 uses a motor torque endpoint detection mode to detect whether the semiconductor layer 120 is exposed. This ensures that the CMP process 130 timely stops at the top surfaces of the semiconductor layers 128 and 120. In the present embodiment, the surface $S_{128}$ (now the top surface) of the semiconductor layer 128 is still higher than the top surface $S_{120}$ of the semiconductor layer 120 when the CMP process 130 stops. In another embodiment, the operation 26 may remove the dielectric HM layer 124 using an etching process instead of the CMP process 130, wherein the etching process is selective to the dielectric HM layer 124.

At operation 28, the method 10 (FIG. 1B) performs a CMP process 132 to planarize the top surfaces of the semiconductor layers 120 and 128 (FIG. 2O). Referring to FIG. 2O, the CMP process 132 polishes the semiconductor layers 120 and 128 simultaneously. In the present embodiment, the CMP process 132 is tuned to remove the semiconductor layer 128 slightly faster than to remove the semiconductor layer 120 because the top surface $S_{128}$ may be slightly higher than the top surface $S_{120}$ when the CMP process 132 starts. For example, the CMP process 132 may be tuned to remove the semiconductor layer 128 one to five (1~5) times faster than to remove the semiconductor layer 120. The CMP removal rate selectivity between the semiconductor layers 120 and 128 may be tuned by selecting appropriate CMP consumables such as CMP polishing pad, CMP slurry, and CMP conditioner, as discussed above. In various embodiments, because the materials in the semiconductor layers 120 and 128 are similar with respect to the CMP process 132, the CMP process 132 can planarize both semiconductor layers effectively at the same time. In the present embodiment, the CMP process 132 uses a soft CMP polishing pad and CMP slurry tuned for polishing the semiconductor layers 120 and 128. In a further embodiment, the duration of the CMP process 132 is controlled using a timer mode. When the CMP process 132 stops, the top surface $S_{128}$ of the semiconductor layer 128 is substantially coplanar with the top surface $S_{120}$ of the semiconductor layer 120. Notably, in the present embodiment, the portions of the semiconductor layer 128 that once interfaced with the dielectric HM layer 124 (FIG. 2M) is removed by the CMP processes 130 and 132. The remaining portion of the semiconductor layer 128 is grown out of the semiconductor trench 127, thereby having reduced interfacial defects compared with epitaxial layers grown in typical replacement fin approaches.

At operation 30, the method 10 (FIG. 1B) proceeds to further steps to form the final device 100. In the present embodiment, the device 100 is a FinFET device. To further this embodiment, operation 30 includes forming fins using the semiconductor layers 120 and 128, and the first and second regions 110 and 118. One exemplary fin formation process is illustrated in FIGS. 2P-2R and is briefly discussed below.

Figures 2P, 2Q, 2R:
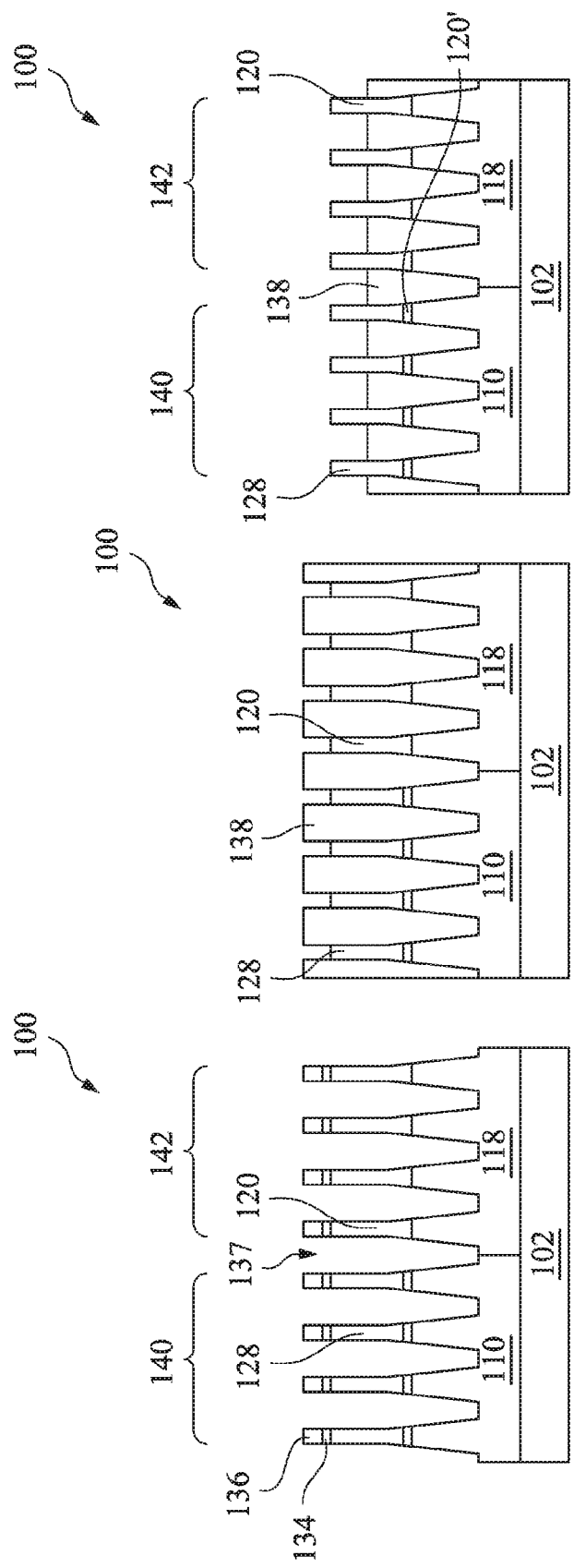

Referring to FIG. 2P, a pad oxide layer 134 and a pad silicon nitride layer 136 are deposited over the semiconductor layers 120 and 128 as blanket layers. Subsequently the layers 136, 134, 128, 120, 118, and 110 are patterned (e.g., through photolithography and etching processes) to provide fins 140 and 142 over the substrate 102. The fins 140 and 142 are separated by trenches 137. The pad oxide layer 134 and the pad silicon nitride layer 136 may be deposited using CVD, PVD, or other suitable methods. The various layers may be etched using wet etching, dry etching, atomic layer etching, or other suitable etching techniques.

Referring to FIG. 2Q, an isolation layer 138 is deposited over the fins 140 and 142, and filling the trenches 137. The isolation layer 138 includes a dielectric material, such as silicon oxide, which electrically isolate the fins 140 and 142 from each other. The isolation layer 138 may be formed by CVD, PECVD, PVD, flowable CVD, thermal oxidation, or other techniques. A CMP process is performed to planarize the isolation layer 138 and stops at the pad silicon nitride layer 136. Subsequently, the pad silicon nitride layer 136 and the pad oxide layer 134 are removed by one or more selective etching processes to expose the semiconductor layers 120 and 128.

Referring to FIG. 2R, the isolation layer 138 is etched back to provide portions of the semiconductor layers 120 and 128 above a top surface of the isolation material 138. As shown in FIG. 2R, the fins 140 protrude out of the first region 110 and the fins 142 protrude out of the second region 118. Each of the fins 142 comprises a portion of the semiconductor layer 120 over a portion of the second region 118. Each of the fins 140 comprises a portion 120' of the semiconductor layer 120 over a portion of the first region 110, and further comprises a portion of the semiconductor layer 128. As discussed above, the portion 120' may have a thickness ranging from 0 nm to 50 nm in various embodiments for fine tuning the device 100's performance. Furthermore, the substrate regions 110 and 118 and the semiconductor layers 120 and 128 are doped with the first, second, third, and fourth dopants, respectively. The first and fourth dopants are of the same type, which is opposite to the type of the second and third dopants. In an embodiment, the first and fourth dopants are n-type dopants, while the second and third dopants are p-type dopants. In another embodiment, the first and fourth dopants are p-type dopants, while the second and third dopants are n-type dopants. As discussed above, the semiconductor fins 140 and 142 are provided with high quality epitaxial films. Compared with epitaxial layers deposited using typical replacement fin approaches, the semiconductor fins 140 and 142 do not suffer from interfacial defects as seen with those epitaxial layers.

FIGS. 3A-3C show a flow chart of the method 50 for forming the semiconductor device 200. The method 50 is an embodiment of the method 10, while the semiconductor device 200 is an embodiment of the semiconductor device 100. For the purposes of simplicity, many details of the method 50 and the device 200 are omitted or abbreviated by referring to the method 10 and the device 100 aforementioned.

Referring to FIG. 3A, at operation 12, the method 50 provides a precursor of the device 200 that includes a substrate 102 having first and second regions 110 and 118, as shown in FIG. 4A. The first and second regions 110 and 118 are doped with the first and second dopants respectively. The device 200 in FIG. 4A may be formed using a process illustrated in FIGS. 2A-2F, as discussed above.

At operation 52, the method 50 (FIG. 3A) deposits a dielectric HM layer 202 over the substrate 102 (i.e., over the first and second regions 110 and 118). Referring to FIG. 4B, in the present embodiment, the dielectric HM layer 202 is deposited to a thickness $H_{202}$ ranging from 5 nm to 50 nm. In various embodiments, the dielectric HM layer 202 may comprise silicon oxide, silicon nitride, silicon oxynitride, silicon carbide, silicon carbide nitride, silicon carbide oxynitride, or another suitable dielectric material. The dielectric HM layer 202 may be formed using thermal oxidation, CVD, PECVD, PVD, ALD, or other suitable techniques. In the present embodiment, the dielectric HM layer 202 is deposited over the entire surface of the substrate 102.

Figures 4C, 4D, 4E:
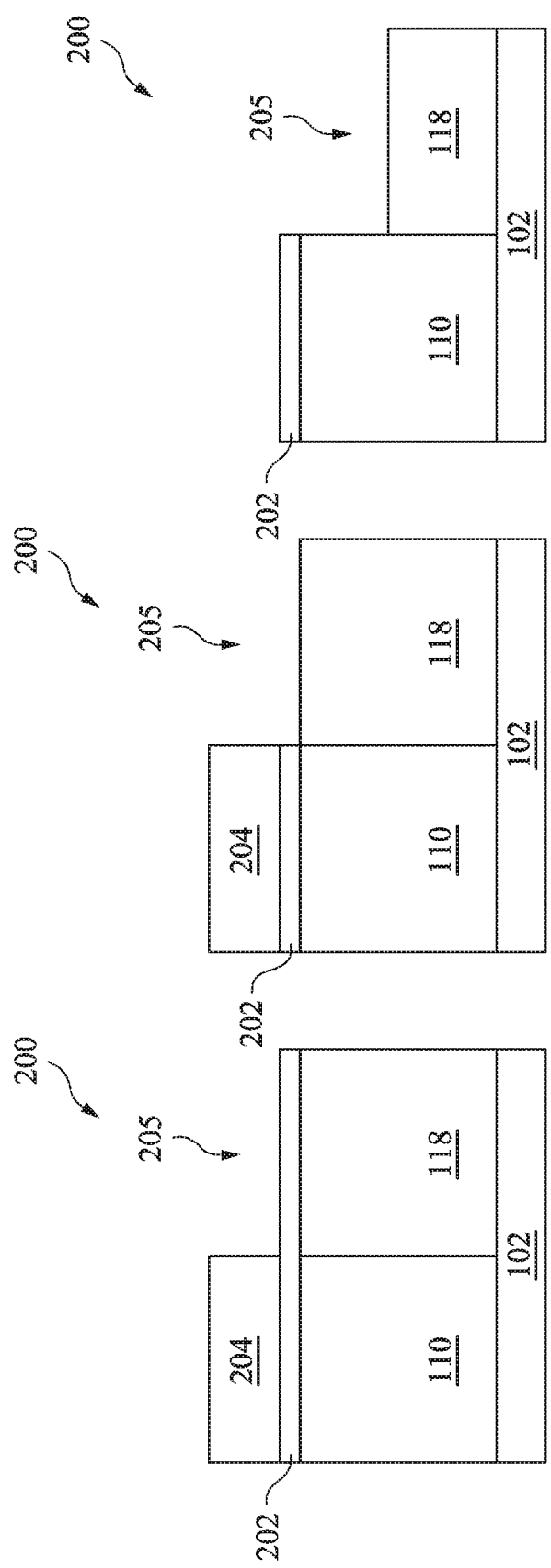

At operation 54, the method 50 (FIG. 3A) patterns the dielectric HM layer 202 to provide an opening 205 that exposes the second region 118 (FIGS. 4C and 4D). This involves one or more photolithography and etching processes. For example, the photolithography process forms a resist pattern 204 over the device 200, wherein the resist pattern 204 provides the opening 205 over the second region 118 (FIG. 4C). For example, the etching process etches the dielectric HM layer 202 through the opening 205, thereby exposing the second region 118 (FIG. 4D). The photolithograph process and the etching process may be similar to those discussed with respect to FIGS. 2A-2B, 2D-2E, and 2J-2K.

At operation 56, the method 50 (FIG. 3A) recesses the second region 118 through the opening 205. Referring to FIG. 4E, the second region 118 is partially removed, resulting in a recessed second region 118. In the present embodiment, operation 56 uses an anisotropic dry etching process. The depth of etching is controlled by a timer in an embodiment. The dielectric HM layer 202 protects other areas of the device 200, including the first region 110, during the etching process. In the present disclosure, the opening 205 is also called a semiconductor trench 205 because it is surrounded by semiconductor material at its bottom and sidewalls (a top portion of the opening 205 is adjacent to the dielectric HM layer 202, but this portion is insignificant as will be discussed later).

At operation 14A, the method 50 (FIG. 3A) deposits a semiconductor layer 120 in the opening 205 and over the recessed second region 118. In an embodiment, the process of forming the semiconductor layer 120 is similar to what is discussed with respect to the semiconductor layer 120 in FIG. 2G. Therefore, the operation 14A may be considered an embodiment of the operation 14 (FIG. 1A). One difference between the operations 14 and 14A is that the operation 14 deposits the semiconductor layer 120 over an entire surface of the device 100 (FIG. 2G), while the operation 14A deposits the semiconductor layer 120 in selected local areas of the device 200, such as in the opening 205 (FIG. 4F). With respect to FIG. 4F, the semiconductor layer 120 is deposited to a thickness $H_{120}$ ranging from 50 nm to 200 nm, and is doped with the third dopant that is of the same type as the second dopant. Further, in the present embodiment, the top surface $S_{120}$ of the semiconductor layer 120 is higher than a top surface $S_{202}$ of the dielectric HM layer 202.

At operation 58, the method 50 (FIG. 3A) performs a CMP process 206 to planarize the top surface $S_{120}$ of the semiconductor layer 120 (FIG. 4G). The CMP process 206 stops at the top surface $S_{202}$ of the dielectric HM layer 202. As a result, the top surfaces $S_{120}$ and $S_{202}$ are substantially coplanar. In an embodiment, the CMP process 206 is tuned to remove the semiconductor layer 120 faster than to remove the dielectric HM layer 202. For example, the CMP removal rate of the semiconductor layer 120 is at least ten times faster than the CMP removal rate of the dielectric HM layer 202. The CMP removal rate selectivity may be tuned by choosing appropriate CMP consumables such as CMP polishing pad, CMP slurry, and CMP conditioner, as discussed above. In the present embodiment, the CMP process 206 uses a hard polishing pad and a CMP slurry that are selective to the material of the semiconductor layer 120. In a further embodiment, the CMP process 206 uses a motor torque endpoint detection mode to detect whether the semiconductor layer 120 has become substantially coplanar with the dielectric HM layer 202.

At operation 60, the method 50 (FIG. 3B) removes the dielectric HM layer 202 over the first region 110 (FIG. 4H). In an embodiment, it is desirable to remove the dielectric HM layer 202 and re-deposit another dielectric layer (as discussed in operation 18A) because the dielectric HM layer 202 may have less-than-desired uniformity post the CMP process 206. The dielectric HM layer 202 may be removed using wet etching, dry etching, atomic layer etching, or other suitable etching techniques. In an embodiment, the dielectric HM layer 202 is removed only in selected areas, such as the area directly over the first region 110. As a result, other areas of the device 200 may still be covered by the dielectric HM layer 202. After the dielectric HM layer 202 is removed, there is a step between the first region 110 and the semiconductor layer 120, i.e. the top surface $S_{120}$ of the semiconductor layer 120 is higher than a top surface $S_{110}$ of the first region 110.

At operation 18A, the method 50 (FIG. 3B) deposits another dielectric HM layer 208 over the first region 110 and the semiconductor layer 120 (FIG. 4I). The dielectric HM layer 208 may comprise silicon oxide, silicon nitride, silicon oxynitride, silicon carbide, silicon carbide nitride, silicon carbide oxynitride, or another suitable dielectric material; and may be deposited using thermal oxidation, CVD, PECVD, PVD, ALD, or other suitable techniques. Due to the step between the first region 110 and the semiconductor layer 120, the dielectric HM layer 208 is deposited relatively thicker than the dielectric HM layer 202 in order to cover the step. In an embodiment, the dielectric HM layer 208 is deposited to a thickness $H_{208}$ ranging from 20 nm to 100 nm. In a further embodiment, the thickness of the dielectric HM layer 208 is substantially uniform. As shown in FIG. 4I, the dielectric HM layer 208 is higher over the second region 118 than over the first region 110 along the "z" direction. The operation 18A may be considered an embodiment of the operation 18 (FIG. 1A).

At operation 20A, the method 50 (FIG. 3B) patterns the dielectric HM layer 208 to provide an opening 209 directly over the first region 110 (FIGS. 4J and 4K). The operation 20A may be considered an embodiment of the operation 20 (FIG. 1A). As shown in FIG. 4J, a resist pattern 210 is formed and having the opening 209. Referring to FIG. 4K, the dielectric HM layer 208 is etched through the opening 209, thereby exposing the first region 110.

At operation 22A, the method 50 (FIG. 3B) extends the opening 209 towards the substrate 102. The operation 22A may be considered an embodiment of the operation 22 (FIG. 1A). Referring to FIG. 4L, the first region 110 is recessed, resulting in a recessed first region 110. The top surface $S_{110}$ of the recessed first region 110 may be the same as, lower than, or higher than a top surface $S_{118}$ of the second region 118, depending on device performance needs in various embodiments. In the present embodiment, the two surfaces $S_{110}$ and $S_{118}$ are substantially coplanar. In an embodiment, the operation 22A uses a dry etching process and a timer mode to achieve a desired etching depth. In the present disclosure, the opening 209 is also called a semiconductor trench 209 because it is surrounded by semiconductor material at its bottom and sidewalls (a top portion of the opening 209 is adjacent to the dielectric HM layer 208, but this portion is insignificant as will be discussed later).

At operation 24, the method 50 (FIG. 3B) deposits a semiconductor layer 128 in the opening 209 and over the recessed first region 110 (FIG. 4M). Further, the semiconductor layer 128 is doped with the fourth dopant. This operation is substantially the same as the operation 24 of the method 10 (FIG. 1B). The semiconductor layer 128 has a thickness $H_{128}$ ranging from 30 nm to 150 nm. A surface $S_{128}$ of the semiconductor layer 128 is higher than the top surface $S_{120}$ of the semiconductor layer 120, but is lower than a top surface $S_{208}$ of the dielectric HM layer 208 directly over the second region 118. The semiconductor layer 128 may be partially deposited over the dielectric HM layer 208. Notably, both the semiconductor layers 120 and 128 are grown in openings surrounded by semiconductor material(s). Therefore, defects at the interfaces between the semiconductor layer 120 (or 128) and the surrounding materials are substantially reduced compared with those epitaxial layers grown in replacement fin approaches.

At operation 26, the method 50 (FIG. 3C) removes the dielectric HM layer 208 over the semiconductor layer 120. In an embodiment, the operation 26 performs a CMP process 130 to remove the dielectric HM layer 208. Refer to FIG. 4N, the dielectric HM layer 208 is removed and the semiconductor layers 120 and 128 are exposed. In another embodiment, the operation 26 removes the dielectric HM layer 208 using an etching process selective to the dielectric HM layer 208. This operation is substantially the same as the operation 26 of the method 10 (FIG. 1B). In the present embodiment, the surface $S_{128}$ (now the top surface of the semiconductor layer 128) is slightly higher than the top surface $S_{120}$ after this operation completes.

Figure 4O:
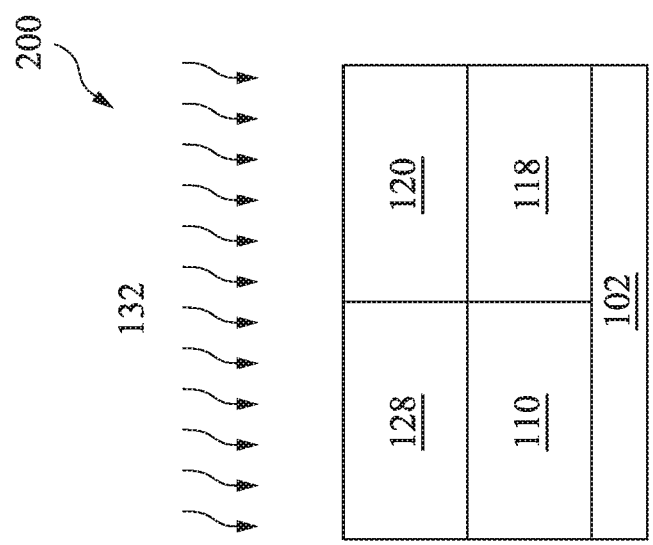

At operation 28, the method 50 (FIG. 3C) performs a CMP process 132 to planarize the semiconductor layers 120 and 128 (FIG. 4O). This operation is substantially the same as the operation 28 of the method 10 (FIG. 1B). As a result of this operation, the top surface $S_{128}$ becomes substantially coplanar with the top surface $S_{120}$. Notably, in the present embodiment, the portions of the semiconductor layers 120 and 128 that once interfaced with the dielectric HM layer 202 (FIG. 4F) and the dielectric HM layer 208 (FIG. 4M), respectively, are removed by the CMP processes 130 and 132. The remaining portions of the semiconductor layers 120 and 128 are grown out of the semiconductor trenches 205 and 209 respectively, thereby having reduced interfacial defects compared with epitaxial layers grown in typical replacement fin approaches.

At operation 30, the method 50 (FIG. 3C) proceeds to further steps to form a final device 200. In the present embodiment, the device 200 is a FinFET device. To further this embodiment, operation 30 includes forming fins using the semiconductor layers 120 and 128, and the first and second regions 110 and 118. One exemplary fin formation process for the device 200 is illustrated in FIGS. 4P, 4Q, and 4R, which is substantially the same as the fin formation process illustrated in FIGS. 2P, 2Q, and 2R respectively.

As shown in FIG. 4R, fins 144 protrude out of the first region 110 and fins 142 protrude out of the second region 118. Each of the fins 142 comprises a portion of the semiconductor layer 120 over a portion of the second region 118. Each of the fins 144 comprises a portion of the semiconductor layer 128 over a portion of the first region 110. Furthermore, the substrate regions 110 and 118 and the semiconductor layers 120 and 128 are doped with the first, second, third, and fourth dopants, respectively. The first and fourth dopants are of the same type, which is opposite to the type of the second and third dopants. In an embodiment, the first and fourth dopants are n-type dopants, while the second and third dopants are p-type dopants. In another embodiment, the first and fourth dopants are p-type dopants, while the second and third dopants are n-type dopants.

Although not intended to be limiting, one or more embodiments of the present disclosure provide many benefits to a semiconductor device and a formation process thereof. For example, embodiments of the present disclosure provide methods of epitaxially growing semiconductor layers, planarizing the semiconductor layers, and etching the semiconductor layers to form fins. The semiconductor layers are thinner than those epitaxial layers in typical SRB approaches, preventing crosshatch pattern defects. Further, the semiconductor layers are formed in semiconductor trenches, instead of dielectric trenches, thereby reducing interfacial defects compared with typical replacement fin approaches. Embodiments of the present disclosure can be easily integrated into existing semiconductor manufacturing flows.

In one exemplary aspect, the present disclosure is directed to a method of forming a semiconductor device. The method includes providing a semiconductor substrate, wherein the semiconductor substrate has a first region and a second region that is adjacent to the first region, the first and second regions are doped with first and second dopants respectively, and the first and second dopants are of opposite types. The method further includes epitaxially growing a first semiconductor layer over the substrate, wherein the first semiconductor layer is doped with a third dopant and the first and third dopants are of opposite types. The method further includes depositing a dielectric hard mask (HM) layer over the first semiconductor layer; patterning the dielectric HM layer to have an opening over the first region; and extending the opening towards the semiconductor substrate. The method further includes epitaxially growing a second semiconductor layer in the opening, wherein the second semiconductor layer is doped with a fourth dopant, the first and fourth dopants are of a same type, and a surface of the second semiconductor layer is higher than a top surface of the first semiconductor layer directly over the second region and is lower than a top surface of the dielectric HM layer directly over the second region. The method further includes removing the dielectric HM layer; and performing a first CMP process to planarize both the first and second semiconductor layers.

In another exemplary aspect, the present disclosure is directed to a method of forming a semiconductor device. The method includes providing a semiconductor substrate, wherein the semiconductor substrate has a first region and a second region that is adjacent to the first region, the first and second regions are doped with first and second dopants respectively, and the first and second dopants are of opposite types. The method further includes depositing a first dielectric hard mask (HM) layer over the substrate; patterning the first dielectric HM to have a first opening that exposes the second region; and recessing the second region through the first opening. The method further includes epitaxially growing a first semiconductor layer over the substrate and in the first opening, wherein the first semiconductor layer is doped with a third dopant, the first and third dopants are of opposite types, and wherein a top surface of the first semiconductor layer is higher than a top surface of the first dielectric HM layer directly over the first region. The method further includes performing a first CMP process to the first semiconductor layer, wherein the first CMP process stops on the first dielectric HM layer. The method further includes depositing a second dielectric HM layer over the first region and over the first semiconductor layer; patterning the second dielectric HM layer to have a second opening over the first region; and extending the second opening towards the semiconductor substrate, thereby partially removing the first region. The method further includes epitaxially growing a second semiconductor layer in the second opening, wherein the second semiconductor layer is doped with a fourth dopant, the first and fourth dopants are of a same type, and a surface of the second semiconductor layer is higher than a top surface of the first semiconductor layer directly over the second region and is lower than a top surface of the second dielectric HM layer directly over the second region. The method further includes performing a second CMP process to remove the second dielectric HM layer and to expose both the first and second semiconductor layers; and performing a third CMP process to planarize both the first and second semiconductor layers.

In yet another exemplary aspect, the present disclosure is directed to a semiconductor device. The semiconductor device comprises a semiconductor substrate having a first region and a second region, wherein the first and second regions are doped with first and second dopants respectively. The semiconductor device further comprises first fins protruding out of the first region; second fins protruding out of the second region; and an isolation structure between adjacent first and second fins. Each of the second fins comprises a first semiconductor layer over a portion of the second region. Each of the first fins comprises the first semiconductor layer over a portion of the first region and further comprises a second semiconductor layer over the first semiconductor layer. The first semiconductor layer is doped with a third dopant that is of a same type as the second dopant. The second semiconductor layer is doped with a fourth dopant that is of a same type as the first dopant.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a semiconductor substrate, wherein the semiconductor substrate has a first region and a second region, the first and second regions are doped with first and second dopants respectively, and the first and second dopants are of opposite types;
epitaxially growing a first semiconductor layer over the substrate, wherein the first semiconductor layer is doped with a third dopant, and the first and third dopants are of opposite types;
depositing a dielectric hard mask (HM) layer over the first semiconductor layer;
patterning the dielectric HM layer to have an opening over the first region;
extending the opening towards the semiconductor substrate;
epitaxially growing a second semiconductor layer in the opening, wherein the second semiconductor layer is doped with a fourth dopant, the first and fourth dopants are of a same type, and a surface of the second semiconductor layer is higher than a top surface of the first semiconductor layer directly over the second region and is lower than a top surface of the dielectric HM layer directly over the second region;
removing the dielectric HM layer; and
performing a first CMP process to planarize both the first and second semiconductor layers.

2. The method of claim 1, further comprising, before the depositing of the dielectric HM layer:
performing a second CMP process to the first semiconductor layer.

3. The method of claim 2, wherein the second CMP process is performed only when a surface roughness, Rq, of the first semiconductor layer is greater than 0.5 nanometers.

4. The method of claim 1, wherein the extending of the opening partially removes the first semiconductor layer in the opening.

5. The method of claim 1, wherein the extending of the opening completely removes the first semiconductor layer in the opening.

6. The method of claim 1, wherein the extending of the opening completely removes the first semiconductor layer in the opening and partially removes the first region in the opening.

7. The method of claim 1, further comprising, before the epitaxially growing of the first semiconductor layer:
depositing another dielectric HM layer over the substrate;
patterning the another dielectric HM to have another opening that exposes the second region; and
recessing the second region through the another opening, wherein:
the first semiconductor layer is epitaxially grown in the another opening.

8. The method of claim 7, wherein a top surface of the first semiconductor layer is higher than a top surface of the another dielectric HM layer directly over the first region.

9. The method of claim 8, further comprising:
performing a second CMP process to the first semiconductor layer, wherein the second CMP process stops on the another dielectric HM layer.

10. The method of claim 9, wherein the second CMP process is tuned to remove the first semiconductor layer faster than to remove the another dielectric HM layer.

11. The method of claim 9, further comprising, before the depositing of the dielectric HM layer:
removing the another dielectric HM layer over the first region, wherein the dielectric HM layer is deposited higher over the second region than over the first region.

12. The method of claim 1, wherein the dielectric HM layer is removed by a second CMP process.

13. The method of claim 12, wherein the second CMP process is tuned to remove the dielectric HM layer at least ten times faster than to remove the first and second semiconductor layers.

14. The method of claim 1, wherein the first CMP process is tuned to remove the second semiconductor layer one to five times faster than to remove the first semiconductor layer.

15. A method comprising:
providing a substrate having a first doped region and a second doped region;
depositing a first semiconductor layer such that a first portion is on the first doped region and a second portion is on the second doped region;
thinning the first portion of the first semiconductor layer such that the first portion of the first semiconductor layer over the first doped region has a thickness that is less than a thickness of the second portion of the first semiconductor layer over the second doped region;
depositing a second semiconductor layer over the first portion of the first semiconductor layer; and
performing a first CMP process to form a substantially planar surface including a topmost surface of the second semiconductor layer and a topmost surface of the second portion of the first semiconductor layer.

16. The method of claim 15, wherein:
the first doped region and the second semiconductor layer are doped to a first type; and
the second doped region and the first semiconductor layer are doped to a second type that is opposite the first type.

17. The method of claim 15 further comprising:
depositing a hard mask over the second doped region prior to depositing the first semiconductor layer over the first doped region; and
performing a second CMP process prior to the first CMP process to planarize the first semiconductor layer and the hard mask.

18. The method of claim 17, wherein the second CMP process is tuned to remove the hard mask faster than the first semiconductor layer.

19. A method comprising:
providing a substrate having a first doped region of a first dopant type and a second doped region of a second dopant type that is opposite the first dopant type;
forming a first semiconductor layer that includes a dopant of the second dopant type on the first doped region and the second doped region;
recessing the first semiconductor layer over the first doped region;
forming a second semiconductor layer that includes a dopant of the first dopant type over the first doped region; and
performing a CMP process to such that the first semiconductor layer and the second semiconductor layer are substantially co-planar.

20. The method of claim 19, wherein the recessing of the first semiconductor layer over the first doped region removes the first semiconductor layer from over the first doped region.

* * * * *